US012451438B2

(12) United States Patent
Liao

(10) Patent No.: US 12,451,438 B2
(45) Date of Patent: Oct. 21, 2025

(54) LOW-NOISE PACKAGE AND METHOD

(71) Applicant: Taiwan Semiconductor Manufacturing Co., Ltd., Hsinchu (TW)

(72) Inventor: Wen-Shiang Liao, Toufen Township (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 631 days.

(21) Appl. No.: 17/864,603

(22) Filed: Jul. 14, 2022

(65) Prior Publication Data

US 2024/0021537 A1    Jan. 18, 2024

(51) Int. Cl.
*H01L 21/56* (2006.01)
*H01L 21/48* (2006.01)
(Continued)

(52) U.S. Cl.
CPC ........ *H01L 23/552* (2013.01); *H01L 21/4853* (2013.01); *H01L 21/561* (2013.01);
(Continued)

(58) Field of Classification Search
CPC . H01L 23/552; H01L 21/4853; H01L 21/561; H01L 21/565; H01L 23/49816; H01L 23/49838; H01L 23/49822; H01L 23/49833; H01L 24/16; H01L 24/32; H01L 24/73; H01L 24/96; H01L 24/97; H01L 2224/16235; H01L 2224/32225; H01L 2224/73204; H01L 2224/73253; H01L 2224/95001; H01L 2924/1811; H01L 2924/182; H01L 2924/183; H01L 2924/3025; H01L 21/4857; H01L 21/568; H01L 23/66; H01L 25/18; H01L 25/0655; H01L 24/92; H01L 25/50; H01L 21/6835; H01L 23/5389; H01L 24/19; H01L 2221/68345; H01L 2221/68372
(Continued)

(56) References Cited

U.S. PATENT DOCUMENTS 7,855,894 B2 * 12/2010 Inagaki .................. H05K 1/185
174/262
8,263,439 B2 * 9/2012 Marimuthu ............. H01L 25/03
438/126
(Continued)

FOREIGN PATENT DOCUMENTS

TW    201737428 A    10/2017
TW    201947716 A    12/2019

*Primary Examiner* — Vu A Vu
(74) *Attorney, Agent, or Firm* — Slater Matsil, LLP

(57) ABSTRACT

A package structure includes a first redistribution structure, an insulating material over the first redistribution structure, a die embedded in the insulating material, a second redistribution structure over the die and the insulating material, and a first via extending through the insulating material, wherein the first via includes a first inner conductive core,
(Continued)

and a first outer conductive shielding layer, wherein the insulating material is disposed between the first inner conductive core and the first outer conductive shielding layer, and wherein the first outer conductive shielding layer has an annular shape in a top-down view.

20 Claims, 18 Drawing Sheets

(51) Int. Cl.
  *H01L 23/498* (2006.01)
  *H01L 23/552* (2006.01)
  *H01L 23/00* (2006.01)
(52) U.S. Cl.
  CPC ...... *H01L 21/565* (2013.01); *H01L 23/49816* (2013.01); *H01L 23/49838* (2013.01); *H01L 23/49822* (2013.01); *H01L 23/49833* (2013.01); *H01L 24/16* (2013.01); *H01L 24/32* (2013.01); *H01L 24/73* (2013.01); *H01L 24/96* (2013.01); *H01L 24/97* (2013.01); *H01L 2224/16235* (2013.01); *H01L 2224/32225* (2013.01); *H01L 2224/73204* (2013.01); *H01L 2224/73253* (2013.01); *H01L 2224/95001* (2013.01); *H01L 2924/1811* (2013.01); *H01L 2924/182* (2013.01); *H01L 2924/183* (2013.01); *H01L 2924/3025* (2013.01)

(58) Field of Classification Search
  USPC .......................................................... 257/659
  See application file for complete search history.

(56) References Cited

U.S. PATENT DOCUMENTS

| | | | |
|---|---|---|---|
| 8,941,230 B2* | 1/2015 | Kyozuka | H01L 24/24 |
| | | | 257/E25.018 |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,123,789 B2* | 9/2015 | Lin | H01L 21/76898 |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 9,773,747 B2* | 9/2017 | Kainuma | H01L 24/24 |
| 10,818,603 B2* | 10/2020 | Jee | H01L 23/5384 |
| 11,024,954 B2 | 6/2021 | Liu et al. | |
| 11,239,148 B2* | 2/2022 | Lee | H01L 23/49861 |
| 2009/0127686 A1* | 5/2009 | Yang | H01L 24/19 |
| | | | 257/E23.023 |
| 2010/0006330 A1* | 1/2010 | Fu | H01L 24/19 |
| | | | 29/856 |
| 2017/0278806 A1 | 9/2017 | Kuo et al. | |
| 2019/0006305 A1* | 1/2019 | Huang | H01L 21/486 |
| 2021/0020559 A1* | 1/2021 | Hung | H01L 23/49822 |

\* cited by examiner

LOW-NOISE PACKAGE AND METHOD

BACKGROUND

In modern semiconductor devices and systems, integration and miniaturization of components have progressed at an increasingly rapid pace. Many devices on one or more semiconductor dies of a package may cause electrical noise and/or create electromagnetic ("EM") interference by emitting EM emissions. RF devices and inductors are examples of devices which can create electrical noise and EM interference. A noisy source, such as an RF device, generates electrical noise in signals carried in conductive structures such as metal leads. The electrical noise in the conductive leads can impact various other signals and devices in the package. Noisy electrical signals present serious problems in semiconductor packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
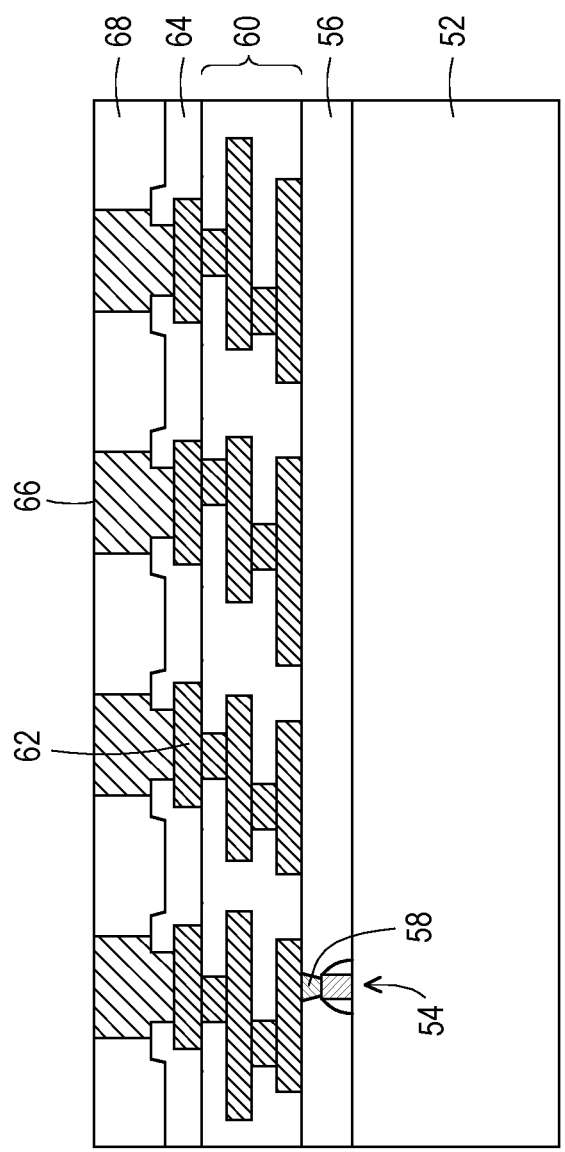
FIG. 1 illustrates a cross-sectional view of an integrated circuit die in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide methods applied to forming an integrated circuit package including a vertical Through Insulator Via (TIV) that electrically couples a first metallization layer to a second metallization layer. The TIV is co-axial in structure and includes an inner conductive core and an outer conductive shielding layer. An insulating layer surrounds the inner conductive core, and the outer conductive shielding layer surrounds the inner conductive core and the insulating layer. The outer conductive shielding layer includes copper and/or copper alloy, and is electrically grounded. The inner conductive core transmits electrical signal and is separated from the outer conductive shielding layer by the insulating layer. Advantageous features of one or more embodiments disclosed herein may allow for a reduction in electromagnetic high-frequency interference to the inner conductive core. In addition, the number of isolation lines and vias of the integrated circuit package can be reduced. Further, one or more embodiments disclosed herein allows for shorter interconnect lengths between package elements, which allows for reduced time delays and improved suitability of the integrated circuit package for advanced portable products. Additionally, because the formation process of the TIV is compatible with current processes, manufacturing costs are reduced and efficiency is increased.

FIG. 1 illustrates a cross-sectional view of an integrated circuit die 50 in accordance with some embodiments. The integrated circuit die 50 will be packaged in subsequent processing to form an integrated circuit package. The integrated circuit die may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, baseband transceiver die, a sensor die, a micro-electro-mechanical-system (MEMS) die, a signal processing die (e.g., digital signal processing (DSP) die), a front-end die (e.g., analog front-end (AFE) dies), a high-performance computing (HPC) die, an artificial intelligence (AI) die, an automotive die, the like, or combinations thereof.

The integrated circuit die 50 may be formed in a wafer, which may include different device regions that are singulated in subsequent steps to form a plurality of integrated circuit dies. The integrated circuit die 50 may be processed according to applicable manufacturing processes to form integrated circuits. For example, the integrated circuit die 50 includes a semiconductor substrate 52, such as silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 1), sometimes called a front side, and an inactive surface (e.g., the surface facing downwards in FIG. 1), sometimes called a back side.

Devices (represented by a transistor) 54 may be formed at the front surface of the semiconductor substrate 52. The devices 54 may be active devices (e.g., transistors, diodes, etc.), capacitors, resistors, etc. An inter-layer dielectric (ILD) 56 is over the front surface of the semiconductor substrate 52. The ILD 56 surrounds and may cover the devices 54. The ILD 56 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like.

Conductive plugs 58 extend through the ILD 56 to electrically and physically couple the devices 54. For example, when the devices 54 are transistors, the conductive plugs 58 may couple the gates and source/drain regions of the transistors. The conductive plugs 58 may be formed of tungsten, cobalt, nickel, copper, silver, gold, aluminum, the like, or combinations thereof. An interconnect structure 60 is over the ILD 56 and conductive plugs 58. The interconnect structure 60 interconnects the devices 54 to form an integrated circuit. The interconnect structure 60 may be formed by, for example, metallization patterns in dielectric layers on the ILD 56. The metallization patterns include metal lines and vias formed in one or more low-k dielectric layers. The metallization patterns of the interconnect structure 60 are electrically coupled to the devices 54 by the conductive plugs 58.

The integrated circuit die 50 further includes pads 62, such as aluminum pads, to which external connections are made. The pads 62 are on the active side of the integrated circuit die 50, such as in and/or on the interconnect structure 60. One or more passivation films 64 are on the integrated circuit die 50, such as on portions of the interconnect structure 60 and pads 62. Openings extend through the passivation films 64 to the pads 62. Die connectors 66, such as conductive pillars (for example, formed of a metal such as copper), extend through the openings in the passivation films 64 and are physically and electrically coupled to respective ones of the pads 62. The die connectors 66 may be formed by, for example, plating, or the like. The die connectors 66 electrically couple the respective integrated circuits of the integrated circuit die 50.

Optionally, solder regions (e.g., solder balls or solder bumps) may be disposed on the pads 62. The solder balls may be used to perform chip probe (CP) testing on the integrated circuit die 50. CP testing may be performed on the integrated circuit die 50 to ascertain whether the integrated circuit die 50 is a known good die (KGD). Thus, only integrated circuit dies 50, which are KGDs, undergo subsequent processing and are packaged, and dies, which fail the CP testing, are not packaged. After testing, the solder regions may be removed in subsequent processing steps.

A dielectric layer 68 may (or may not) be on the active side of the integrated circuit die 50, such as on the passivation films 64 and the die connectors 66. The dielectric layer 68 laterally encapsulates the die connectors 66, and the dielectric layer 68 is laterally coterminous with the integrated circuit die 50. Initially, the dielectric layer 68 may bury the die connectors 66, such that the topmost surface of the dielectric layer 68 is above the topmost surfaces of the die connectors 66. In some embodiments where solder regions are disposed on the die connectors 66, the dielectric layer 68 may bury the solder regions as well. Alternatively, the solder regions may be removed prior to forming the dielectric layer 68.

The dielectric layer 68 may be a polymer such as PBO, polyimide, BCB, or the like; a nitride such as silicon nitride or the like; an oxide such as silicon oxide, PSG, BSG, BPSG, or the like; the like, or a combination thereof. The dielectric layer 68 may be formed, for example, by spin coating, lamination, chemical vapor deposition (CVD), or the like. In some embodiments, the die connectors 66 are exposed through the dielectric layer 68 during formation of the integrated circuit die 50. In some embodiments, the die connectors 66 remain buried and are exposed during a subsequent process for packaging the integrated circuit die 50. Exposing the die connectors 66 may remove any solder regions that may be present on the die connectors 66.

FIGS. 2 through 16 illustrate cross-sectional views and a top-down view of intermediate steps during a process for forming a first package component 100, in accordance with some embodiments. A first package region 100A and a second package region 100B are illustrated, and one or more of the integrated circuit dies 50 are packaged to form an integrated circuit package in each of the package regions 100A and 100B. The integrated circuit packages may also be referred to as integrated fan-out (InFO) packages.

Figure 2:
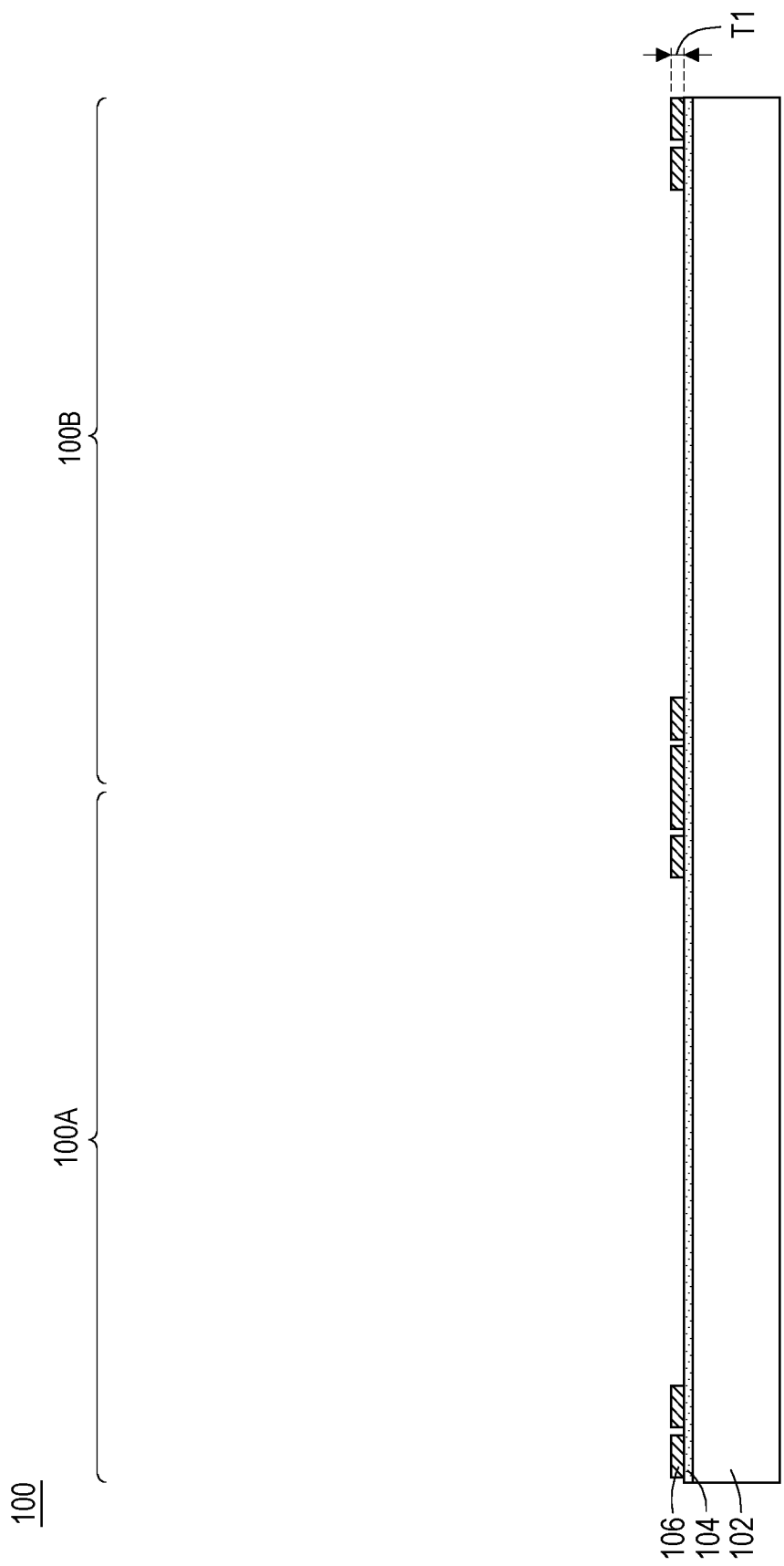
FIGS. 2 through 17 illustrate cross-sectional views and a top-down view of intermediate steps during a process for forming a package component in accordance with some embodiments.

In FIG. 2, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously.

The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be leveled and may have a high degree of planarity.

Still referring to FIG. 2, a redistribution layer (RDL) 106 (which also may be referred to as a metallization pattern) is formed on the release layer 104. The RDL 106 is part of a back-side redistribution structure. To form the RDL 106, a seed layer is first formed on a top surface of the release layer 104. The metal seed layer may comprise, for example, a titanium and copper bilayer (e.g., a layer of copper on a layer of titanium), a singular copper layer, or other suitable metal layer, and may be deposited using a PVD process (e.g., sputtering) or the like. Any suitable thickness may be used for the seed layer. A conductive material layer is then deposited on the seed layer. The conductive material layer may be copper, or the like, that is deposited using a plating process, for example, electroplating, electroless plating, immersion plating, or the like. The seed layer and the conductive material layer may be then be patterned using acceptable photolithography and etching techniques to remove portions of the seed layer and conductive material layer. The remaining portions of the seed layer and overlying conductive material layer form the RDL 106. In an embodiment, the RDL 106 has a thickness T1 that is in a range from 1 μm to 8 μm.

Figure 3:
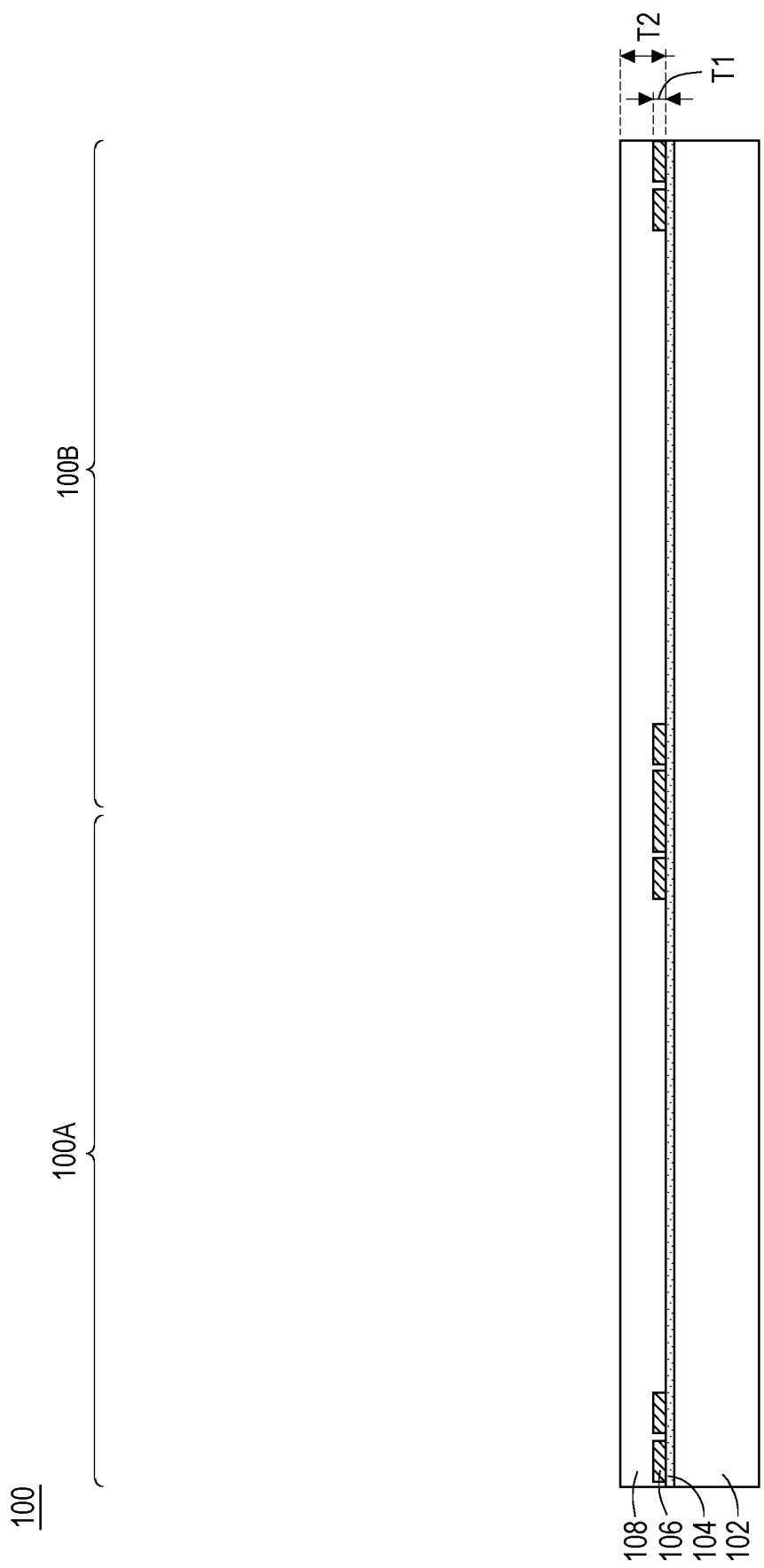

In FIG. 3, a dielectric layer 108 is formed over the RDL 106. The dielectric layer 108 is formed such that the RDL 106 is embedded in the dielectric layer 108. The dielectric layer 108 may be, for example, a layer of polymer material such as, e.g., polybenzoxazole (PBO), polyimide (PI), benzocyclobutene (BCB), or other polymer material that is electrically insulating. The dielectric layer 108 may be formed using a process such as lamination, coating, (e.g., spin-coating), chemical vapor deposition (CVD), or the like. In an embodiment, the dielectric layer 108 is formed using a coating process, after which a curing process is performed on the dielectric layer 108. The curing process may be performed at a temperature that is in a range from 150° C. to 300° C. and for a duration of time that is in a range from 3 hours to 5 hours. In an embodiment, a thickness T2 of the dielectric layer 108 is in a range from 2 μm to 12 μm.

Figure 4:
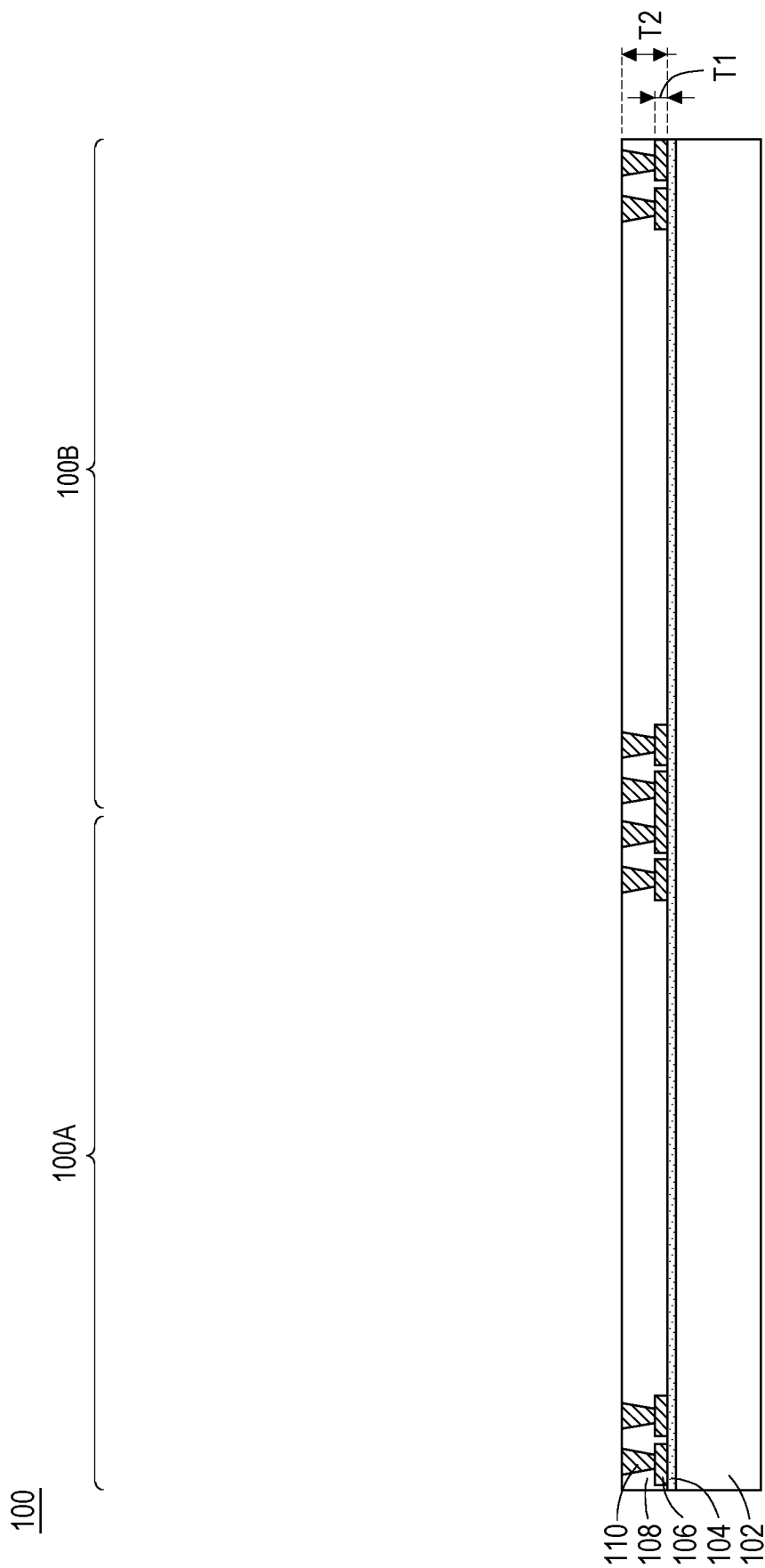

In FIG. 4, a mask layer (e.g., a photoresist) may be formed over the dielectric layer 108 and subsequently patterned to expose top surfaces of the dielectric layer 108. A suitable etching process is then performed using the mask layer as an etching mask to form openings in the dielectric layer 108 that expose top surfaces of the RDL 106. A seed layer (not shown in FIG. 4) that may include, for example, a titanium and copper bilayer (e.g., a layer of copper on a layer of titanium), a singular copper layer, or other suitable metal layer, may be deposited in the openings in the dielectric layer 108, such as on sidewalls of the openings and on the exposed top surfaces of the RDL 106. A conductive material may then be deposited in the openings using a plating process, such as electroplating or electroless plating, in order to fill the openings. The conductive material may include copper, titanium, or the like. The mask layer may then be removed using an acceptable ashing or stripping process.

After the removal of the mask layer, a planarization step, such as a chemical mechanical polish (CMP), may be performed to remove excess portions of the seed layer and the conductive material that are over top surfaces of the dielectric layer 108. The remaining seed layer and the conductive material in the openings forms the vias 110 (which may be referred to as through insulator vias or TIVs). Accordingly, top surfaces of the dielectric layer 108 are level with top surfaces of the vias 110.

Figure 5:
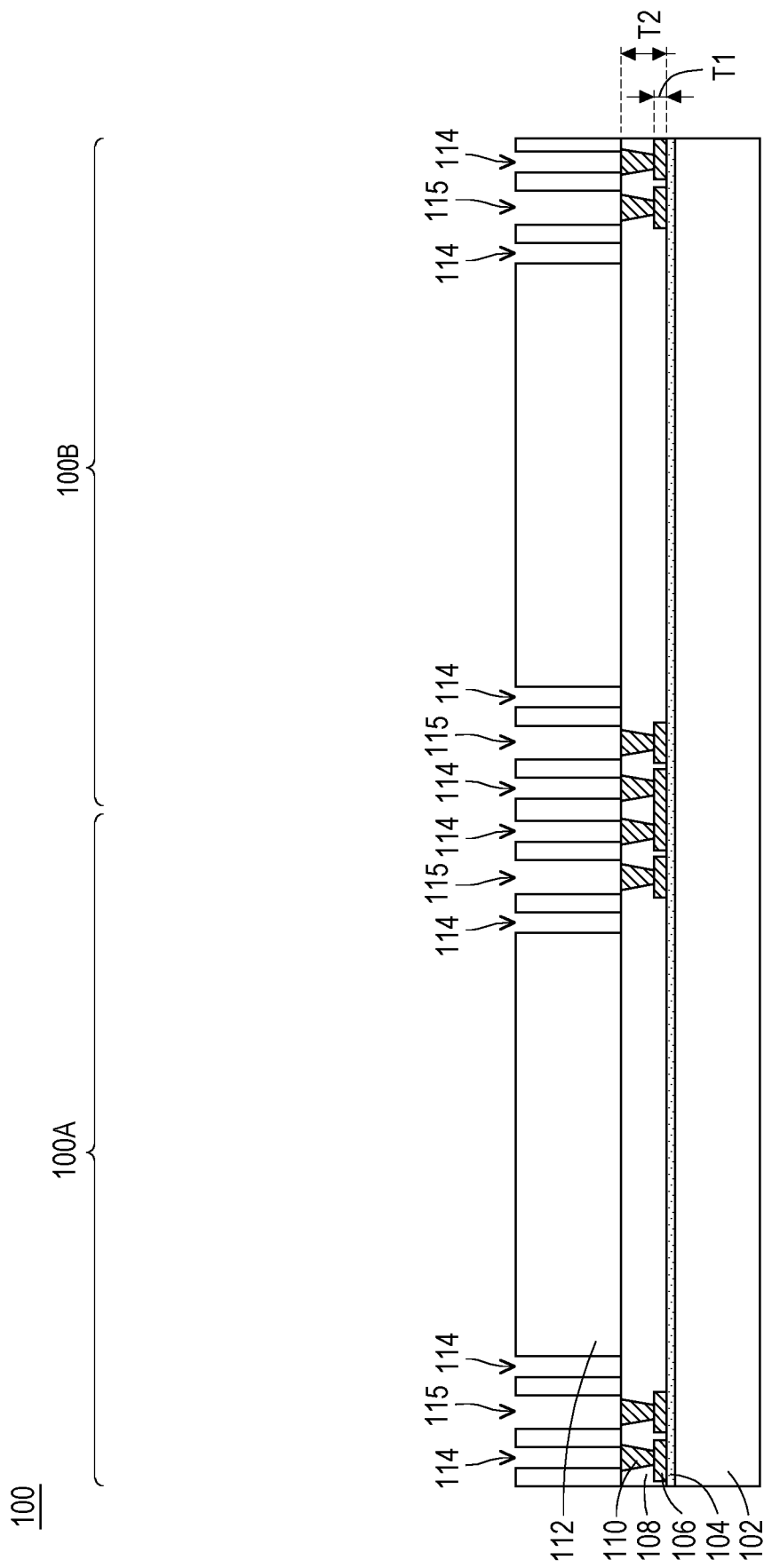

In FIG. 5, a mask layer 112 is formed over the structure shown in FIG. 4, such as over the dielectric layer 108 and the vias 110. The mask layer 112 may be a photoresist, or the like, and may be formed using a spin coating or deposition process. The mask layer 112 may be patterned using acceptable development and exposure techniques to form first openings (or through holes) 114 and second openings 115 in which to subsequently form vias 113 (shown in FIG. 9) that are electrically conductive (which may also be called through-insulator-vias TIVs). Each of these vias 113 include the subsequently formed inner conductive core 120 (shown in FIG. 9) and outer conductive shielding layer 121 (shown in FIG. 9). The first openings 114 may expose top surfaces of the vias 110 and the dielectric layer 108, and the second openings 115 may expose top surfaces of the vias 110. Each of the first openings 114 may be annular in shape when seen in a top-down view, and each of the first openings 114 may surround a corresponding second opening 115.

Figure 6:
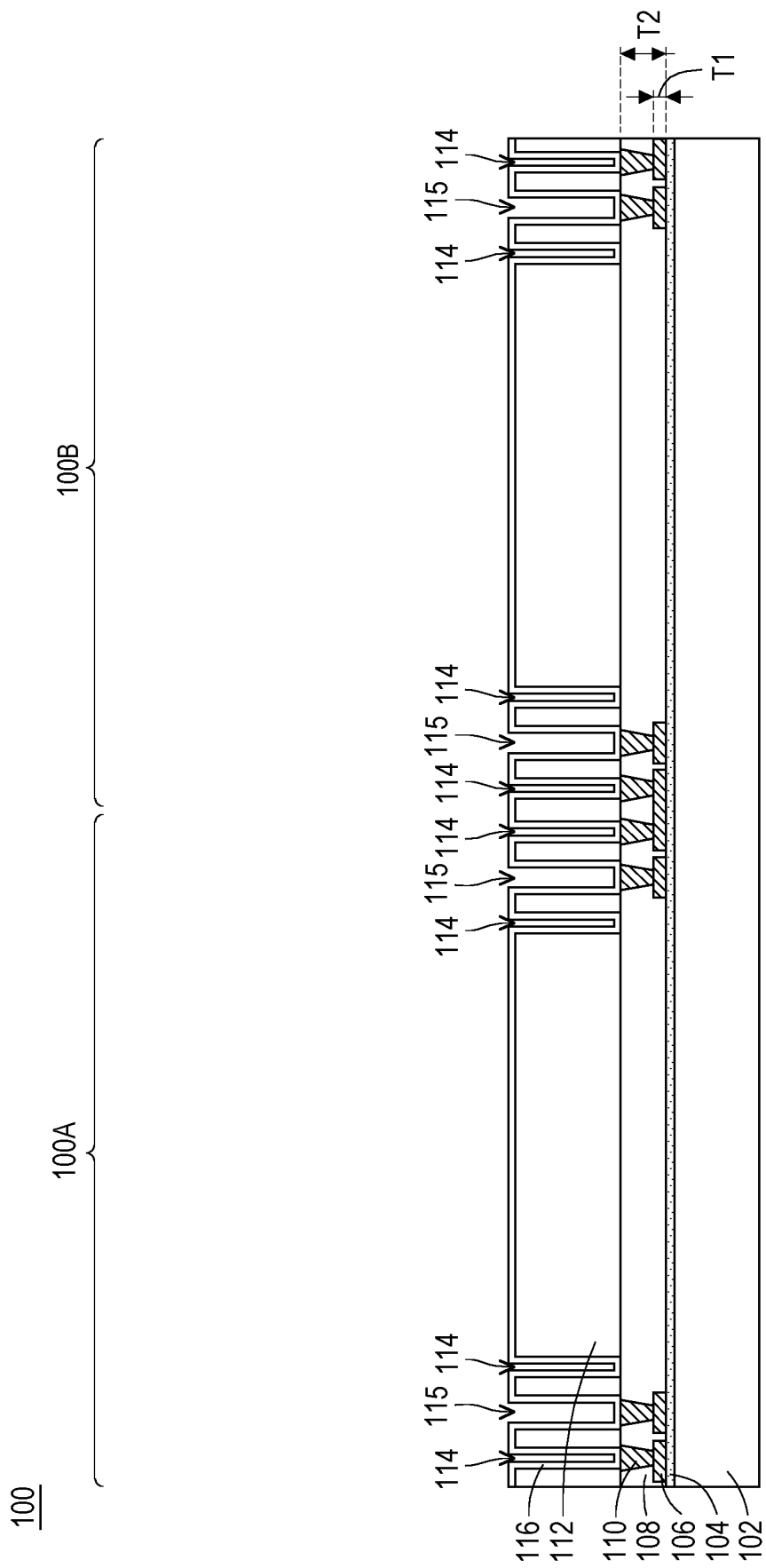

In FIG. 6, a seed layer 116 is formed on the mask layer 112 and in the first openings 114 and the second openings 115 of the mask layer 112, such as on bottom surfaces and sidewalls of the first openings 114, and bottom surfaces and sidewalls of the second openings 115. The metal seed layer 116 may include, for example, a titanium and copper bilayer (e.g., a layer of copper on a layer of titanium), a singular copper layer, or other suitable metal layer, and may be deposited using a PVD process, or the like. Any suitable thickness may be used for the seed layer 116. For example, in some embodiments, the seed layer 116 may include a titanium layer having a thickness that is in a range from 1000 Å to 2000 Å, and a copper layer having a thickness that is in a range from 5000 Å to 10000 Å. In other embodiments, the seed layer 116 may include other combinations of metals and thicknesses.

Figure 7:
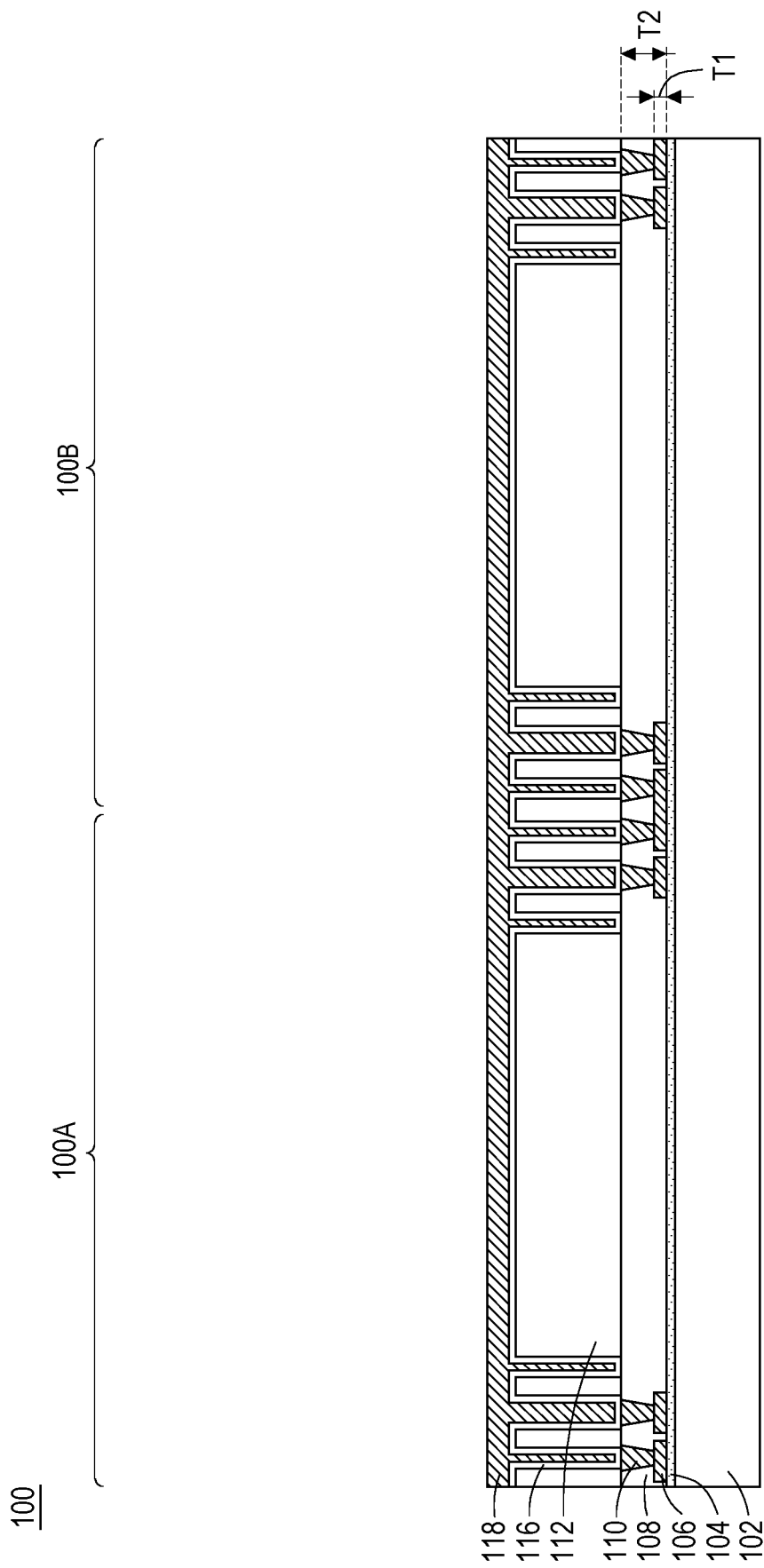

In FIG. 7, a conductive material 118 is formed on the seed layer 116 and in the first openings 114 and the second openings 115, in order to fill in the first openings 114 and the second openings 115. The conductive material 118 may be a copper layer or other suitable metal formed by an electrochemical plating (ECP) process, or the like. During the ECP process, the conductive material 118 is deposited both laterally on the sidewalls of the first openings 114 and the second openings 115, as well as vertically on bottom surfaces of the first openings 114 and the second openings 115.

Figure 8:
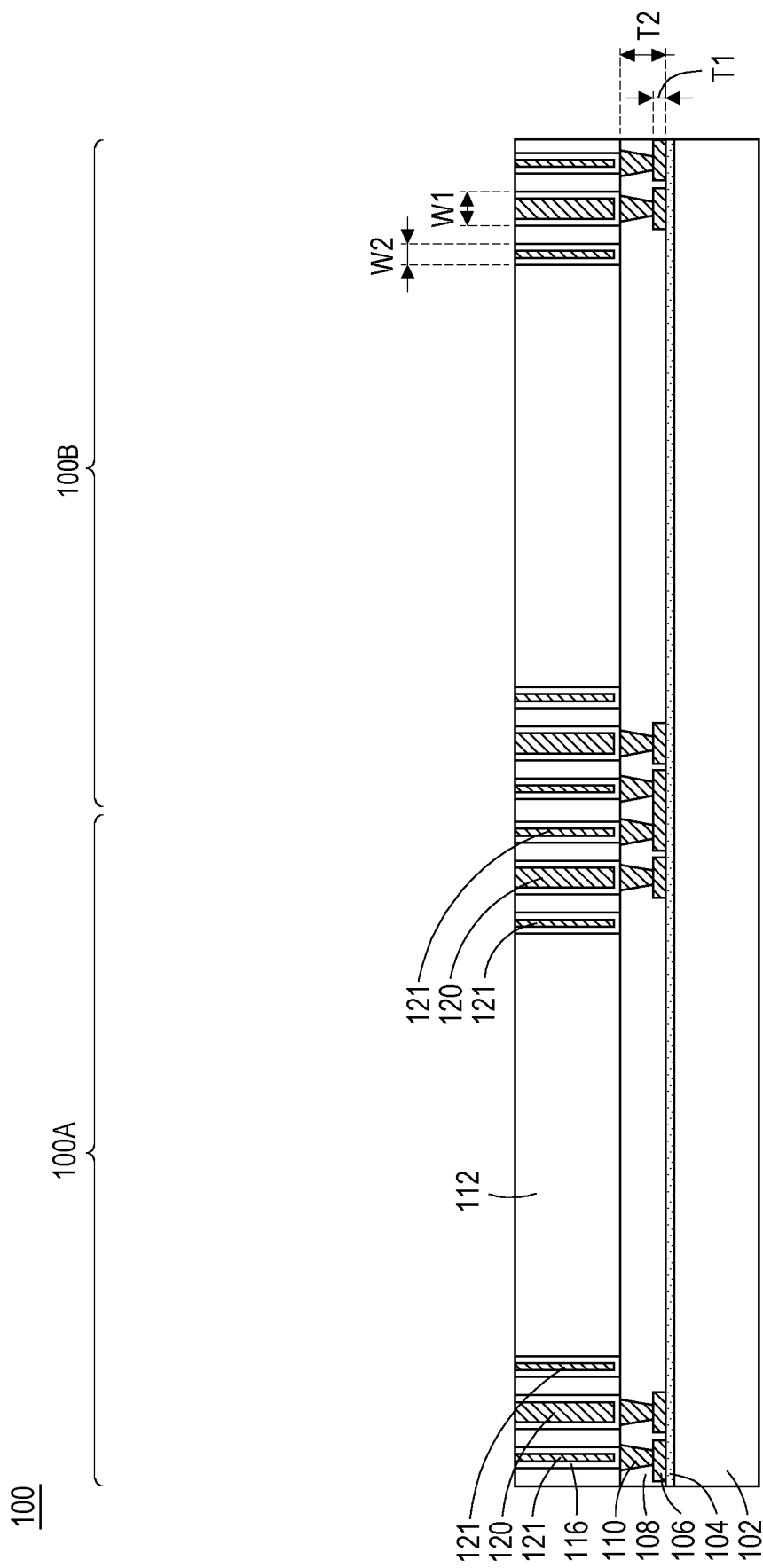

In FIG. 8, a planarization step, such as a chemical mechanical polish (CMP), or the like, may be performed to remove portions of the seed layer 116 and excess portions of the conductive material 118 which are over the mask layer 112. The remaining conductive material 118 and the seed layer 116 in the first openings 114 form the inner conductive cores 120. The remaining conductive material 118 and the seed layer 116 in the second openings 115 form the outer conductive shielding layer 121. Accordingly, after the planarization step, top surfaces of the conductive material 118, the seed layer 116, and the mask layer 112 are level. In an embodiment, each of the inner conductive cores 120 may have a width W1 that is in a range from 10 μm to 300 μm. In an embodiment, a difference between an outer radius and an inner radius of each outer conductive shielding layer 121 may be in a range from 0.5 μm to 150 μm, such as 0.1 μm to 20 μm. The difference between the outer radius and the inner radius of each outer conductive shielding layer 121 may also be referred to as the width W2 subsequently. In an embodiment, the width W1 of each of the inner conductive cores 120 may be larger than the width W2 of a corresponding outer conductive shielding layer 121.

Figure 9:
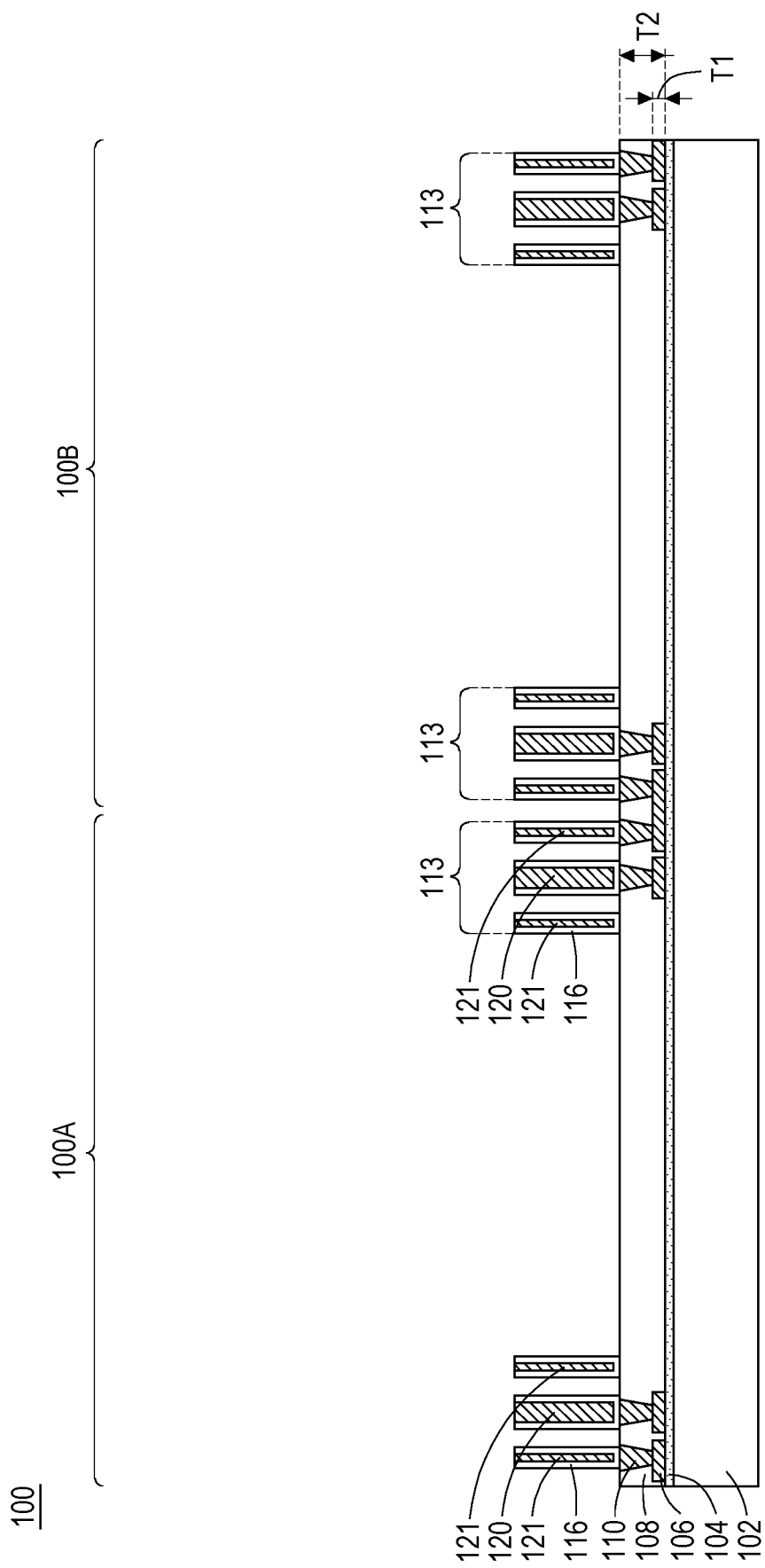

In FIG. 9, after the planarization step, the mask layer 112 may be removed using a suitable removal process such as ashing (e.g., an ozone plasma ashing process) or chemical stripping (e.g., a wet acid clean process).

Figure 10:
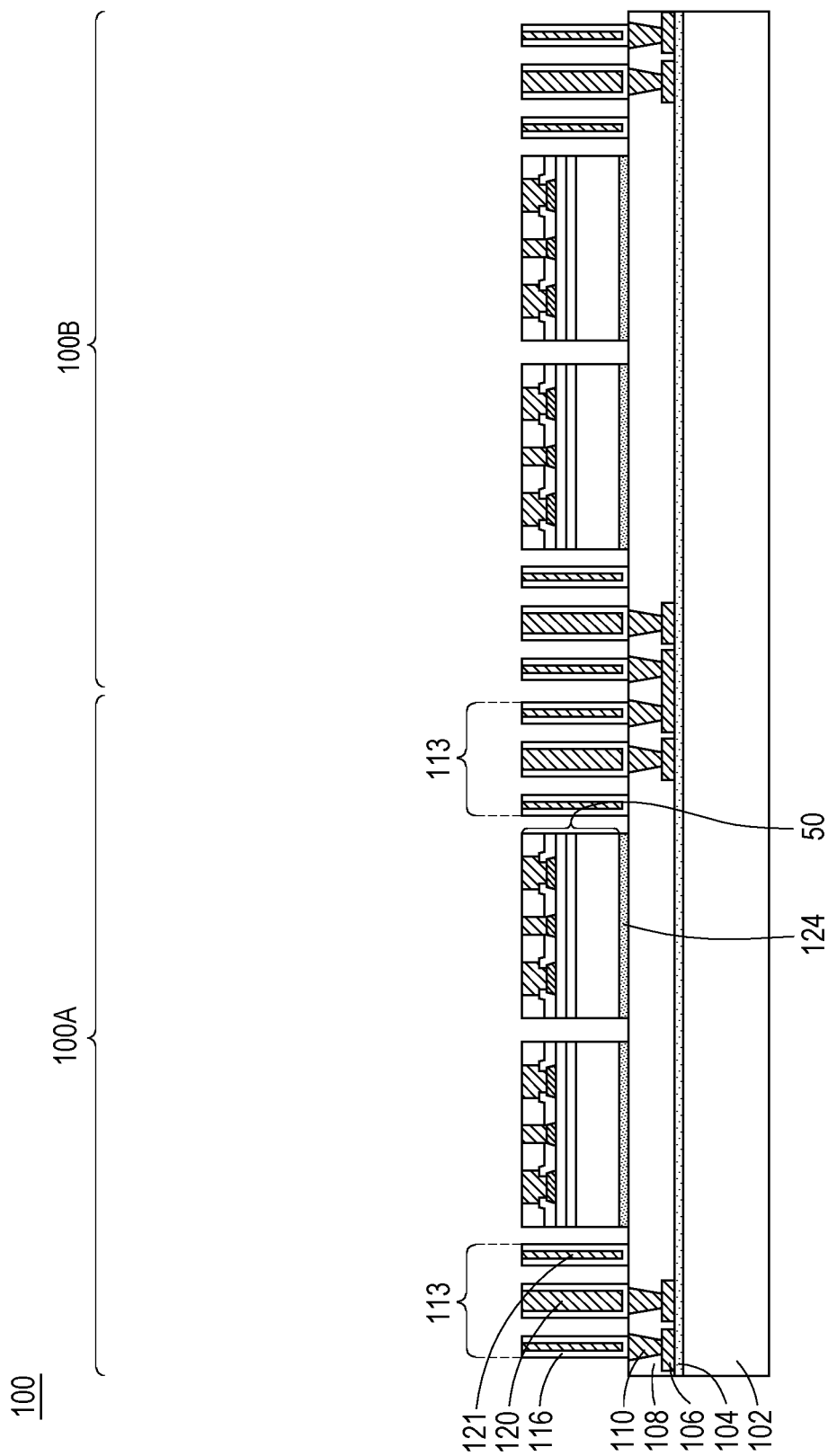

In FIG. 10, a plurality of integrated circuit dies 50 are bonded to a top surface of the dielectric layer 108 using, for example, a pick and place process, or the like. In an embodiment, the plurality of integrated circuit dies 50 are bonded to the top surface of the dielectric layer 108 simultaneously using the pick and place process. The plurality of integrated circuits dies 50 may be disposed such that one or more dies of the plurality of integrated circuit dies 50 are disposed between a first via 113 and a second via 113. In order to bond the plurality of integrated circuit dies 50 to the top surface of the dielectric layer 108, the plurality of integrated circuit dies 50 are first attached to a carrier using an adhesive layer, wherein the adhesive layer is used to facilitate a subsequent debonding of the carrier. The carrier may include silicon-based materials, such as a silicon substrate (e.g., a silicon wafer), a glass material, silicon oxide, or other materials, such as aluminum oxide, the like, or a combination. The carrier may include a transparent material such as glass, or the like. The adhesive layer may include a polymer-based material, which may be removed along with the carrier in subsequent steps. In some embodiments, the adhesive layer may include an epoxy-based thermal-release material, which loses its adhesive property when heated, such as a Light-to-Heat-Conversion (LTHC) release coating. In some embodiments, the adhesive layer may include an ultra-violet (UV) glue, which loses its adhesive property when exposed to UV light. The carrier and the first package component 100 are then transported to a bond chamber where the carrier is oriented to align the plurality of integrated circuit dies 50 with the vias 113 such that the plurality of integrated circuit dies 50 face the dielectric layer 108.

The plurality of integrated circuit dies 50 are pressed against the dielectric layer 108 to couple the plurality of integrated circuit dies 50 to the dielectric layer 108 using a die attach film (DAF) 124 disposed on bottom surfaces of the plurality of integrated circuit dies 50. The DAF 124 may include a polymer, and a first anneal process is then performed in the bond chamber to initiate bonding of the DAF film 124 with the dielectric layer 108. As a result, the plurality of integrated circuit dies 50 are adhered to the dielectric layer 108. The first anneal may be performed at a temperature in a range from 150° C. to 350° C. and for a duration of time that is in a range from 0.5 hours to 4 hours. A de-bonding of the carrier is then performed to detach (or "de-bond") the carrier from the plurality of integrated circuit dies 50. In accordance with some embodiments, the de-bonding includes projecting a light such as a laser light or an UV light on the adhesive layer so that the adhesive layer decomposes under the heat of the light. The carrier can then be mechanically removed leaving the plurality of integrated circuit dies 50 bonded to the dielectric layer 108. After the removal of the carrier, a second anneal may be performed at a temperature in a range from 150° C. to 350° C. and for a duration of time that is in a range from 0.5 hours to 4 hours. The second anneal strengthens the bonding between the plurality of integrated circuit dies 50 and the dielectric layer 108. In other embodiments, the second anneal maybe performed before the removal of the carrier.

Figure 11:
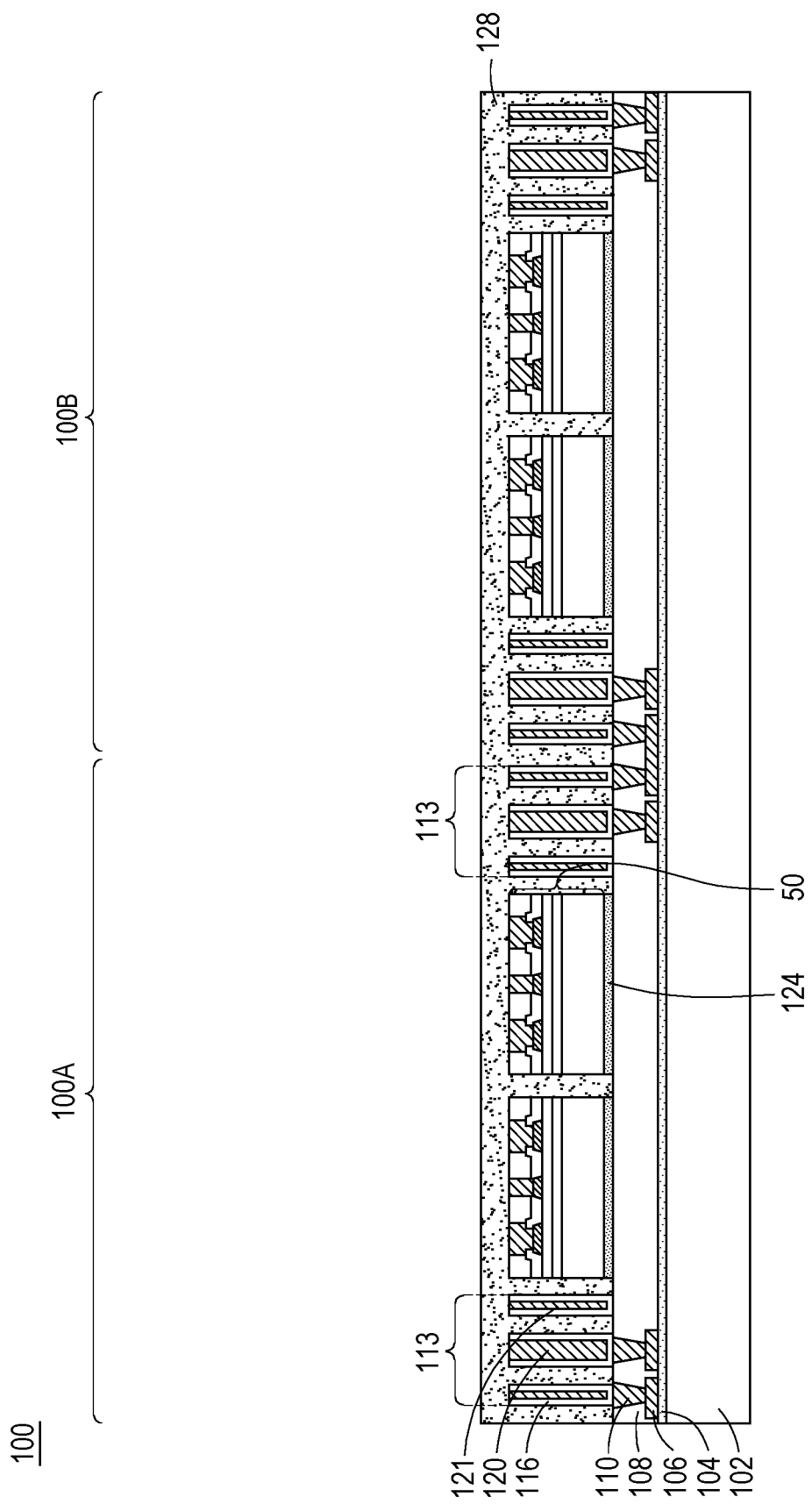

In FIG. 11, an electrically insulating molding material (or molding compound) 128 is formed over the structure shown in FIG. 10, such as on top surfaces and sidewalls of the inner conductive cores 120, top surfaces and sidewalls of the outer conductive shielding layer 121, top surfaces and sidewalls of the plurality of integrated circuit dies 50, sidewalls of the die attach film (DAF) 124, and top surfaces of the dielectric layer 108. The molding material 128 fills spaces between each inner conductive core 120 of a via 113 and its corresponding outer conductive shielding layer 121. The molding material 128 can include a dielectric material, such as silicon-based material, an epoxy molding compound that includes silica, or the like, that provides electrical isolation between each of the vias 113 and other structures of the first package component 100. In addition, the molding material 128 provides electrical isolation between each inner conductive core 120 of a via 113 and its corresponding outer conductive shielding layer 121. The molding material 128 can be formed according to various formation techniques, such as a spin-on process, a deposition process, an injection process, or the like.

Figure 12A:
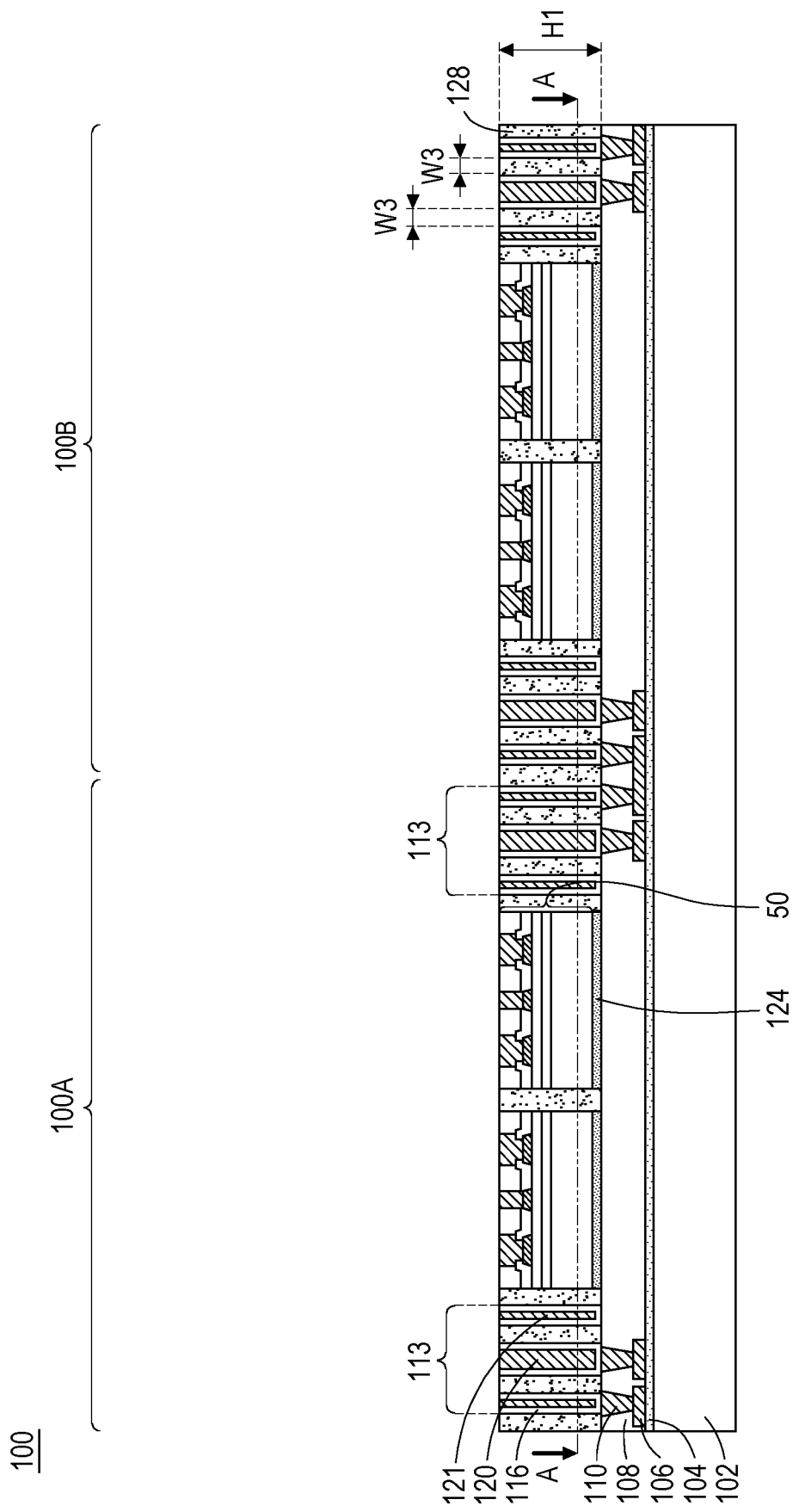

In FIG. 12A, excess portions of the molding material 128 may be planarized by grinding and CMP to remove a portion of the molding material 128 and expose top surfaces of the inner conductive cores 120 and the outer conductive shielding layer 121. During the planarization, a portion of the dielectric layer 68 of each of the plurality of integrated circuit dies 50 may also be removed so as to expose top surfaces of the die connectors 66. As illustrated in FIG. 12A, the planarization may result in the top surfaces of the vias 113 (e.g., the inner conductive cores 120 and the outer conductive shielding layer 121) and the die connectors 66 being level with a top surface of the molding material 128. Each of the co-axial vias 113 includes an inner conductive core 120 and a corresponding outer conductive shielding layer 121, wherein a height of the inner conductive core 120 and a height of the outer conductive shielding layer 121 are the same. In an embodiment, after the planarization, a height H1 of each of the vias 113 (e.g., the inner conductive cores 120 and the outer conductive shielding layer 121) may be in a range from 10 μm to 500 μm. In an embodiment, the molding material 128 between each inner conductive core and its corresponding outer conductive shielding layer 121 may have a width W3 that is in a range from 0.5 μm to 200 μm. Each inner conductive core 120 is electrically connected to the RDL 106 and is configured to transmit electrical signals between the RDL 106 and subsequently formed redistribution layers of a front-side redistribution structure 149 (shown in FIG. 15). The molding material 128 provides electrical isolation between each inner conductive core 120 of a via 113 and its corresponding outer conductive shielding layer 121. The outer conductive shielding layer 121 is electrically grounded through the RDL 106. The outer conductive shielding layer 121 isolates the inner conductive core 120 from electromagnetic interference generated by one or more active devices of the first package component 100 and prevents radiation signal transmission to/from the inner conductive core 120. For example, when radiation is generated near the inner conductive core 120, the radiation encounters the outer conductive shielding layer 121 before reaching the inner conductive core 120. The outer conductive shielding layer 121 drives the electromagnetic signal to ground, dissipating energy in the radiation signal, and preventing inducement of a signal within the inner conductive core 120 caused by the radiation signal. By preventing transmission of radiation signals into the inner conductive core 120, the outer conductive shielding layer 121 reduces or eliminates radiation induced noise in the inner conductive core 120. Similarly, by preventing transmission of radiation signals from the inner conductive core 120, the outer conductive shielding layer 121 reduces or eliminates radiation induced noise caused by the inner conductive core 120 and isolates a transmitted signal within the inner conductive core 120.

Figure 12B:
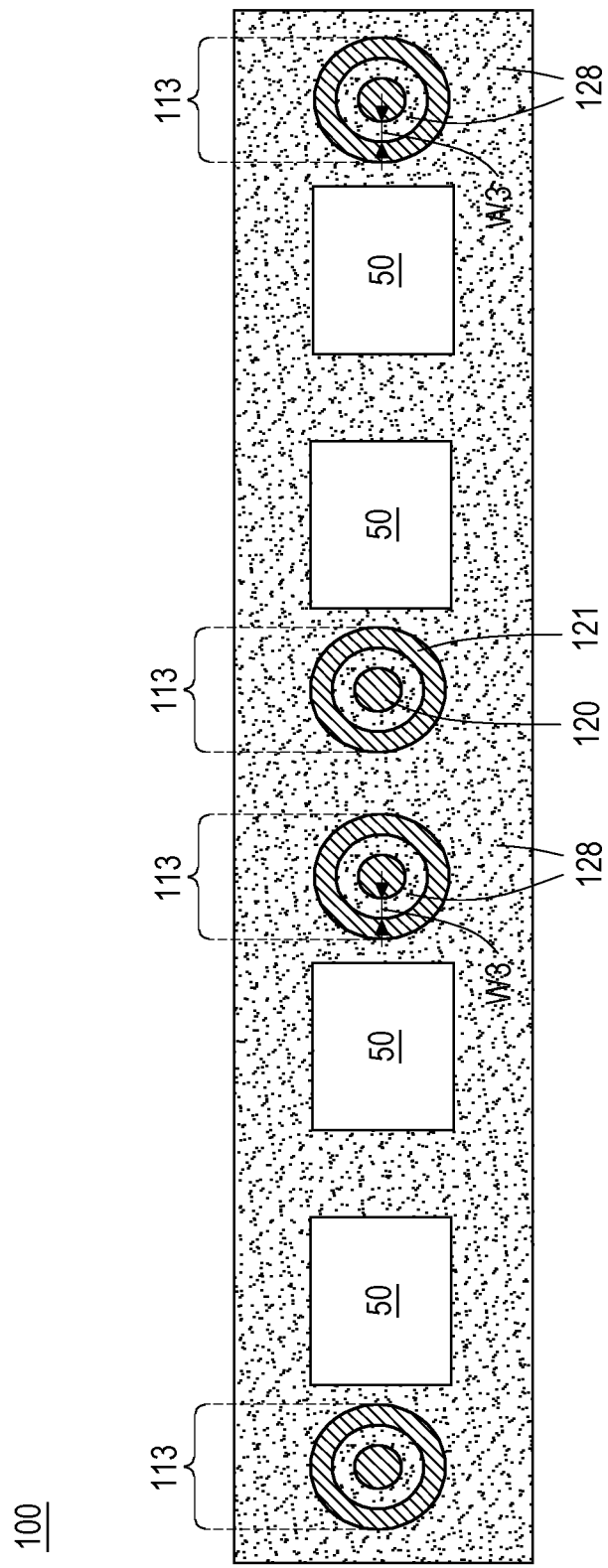

FIG. 12B illustrates a top-down view of a cross-section of the first package component 100 along a line A-A shown in FIG. 12A. The first package component 100 may include at least one or more dies of the plurality of integrated circuit dies 50 being disposed between a first via 113 and a second via 113. Each via 113 includes an inner conductive core 120 that is encircled by a corresponding outer conductive shielding layer 121. Each outer conductive shielding layer 121 has an annular shape, and the molding material 128 is disposed between each inner conductive core 120 and its corresponding outer conductive shielding layer 121. The molding material 128 disposed between each inner conductive core 120 and its corresponding outer conductive shielding layer 121 may have an annular shape.

In FIGS. 13 through 16, additional exemplary processing will now be described for providing additional redistribution layers of the front-side redistribution structure 149, and conductive connectors 158 to provide for input/output (I/O) to die circuitry and electrical I/O to the back-side redistribution structure of the first package component 100.

Figure 13:
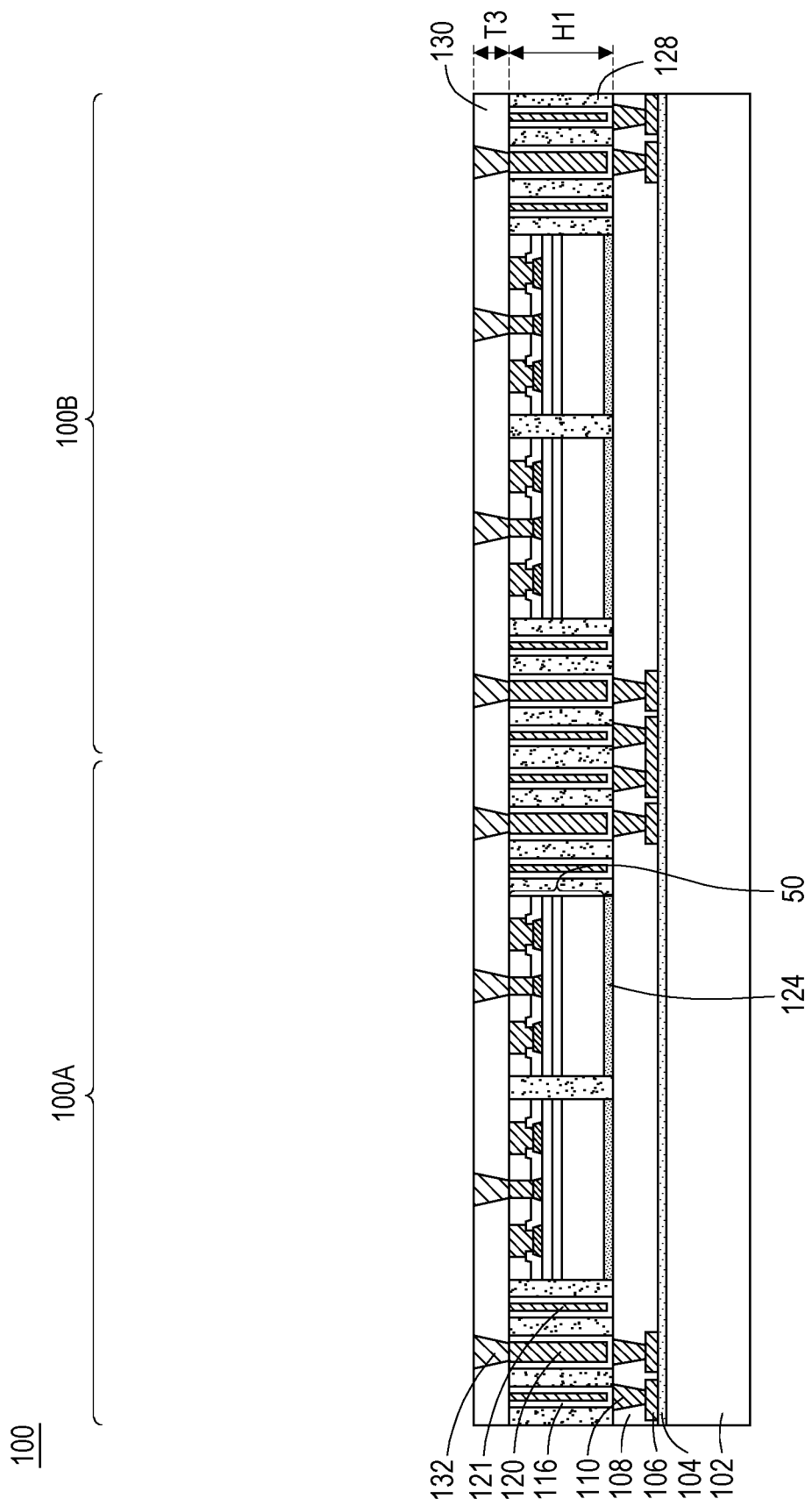

In FIG. 13, a dielectric layer 130 is formed over the vias 113, the molding material 128, and the plurality of integrated circuit dies 50. The dielectric layer 130 may be, for example, a layer of polymer material such as, e.g., polybenzoxazole (PBO), polyimide (PI), benzocyclobutene (BCB), or other polymer material that is electrically insulating. The dielectric layer 130 may be formed using a process such as lamination, coating, (e.g., spin-coating), chemical vapor deposition (CVD), or the like. In an embodiment, the dielectric layer 130 may have a thickness T3 that is equal to or smaller than 4.5 μm.

Referring further to FIG. 13, a mask layer (e.g., a photoresist) may be formed over the dielectric layer 130 and subsequently patterned to expose top surfaces of the dielectric layer 130. A suitable etching process is then performed using the mask layer as an etching mask to form openings in the dielectric layer 130 that expose top surfaces of the inner conductive cores 120 and the die connectors 66. A seed layer (not shown in FIG. 13 may be deposited using a PVD process, or the like, in the openings in the dielectric layer 130, such as on sidewalls of the openings and on the exposed top surfaces of the inner conductive cores 120 and the die connectors 66. The seed layer may include, for example, a titanium and copper bilayer (e.g., a layer of copper on a layer of titanium), a singular copper layer, or other suitable metal layer. A conductive material may then be deposited in the openings using a plating process, such as electroplating or electroless plating, in order to fill the openings. The conductive material may include copper, titanium, or the like. The mask layer may then be removed using an acceptable ashing or stripping process.

After the removal of the mask layer, a planarization step, such as a chemical mechanical polish (CMP), may be performed to remove excess portions of the seed layer and the conductive material that are over top surfaces of the dielectric layer 130. The remaining seed layer and the conductive material in the openings forms the vias 132 (which may be referred to as through insulator vias or TIVs). Accordingly, top surfaces of the dielectric layer 130 are level with top surfaces of the vias 132.

Figure 14:
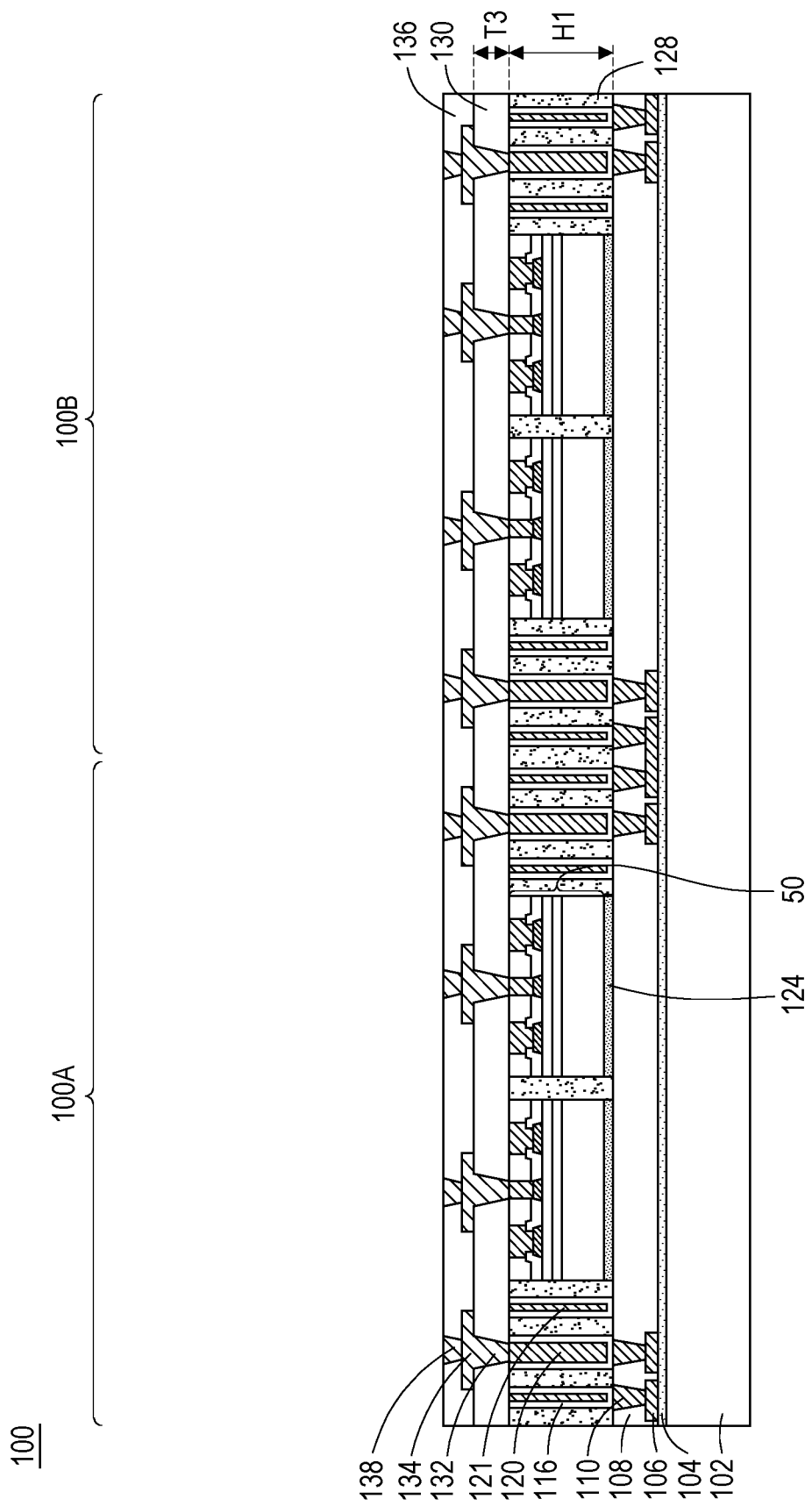

In FIG. 14, a mask layer (e.g., a photoresist) is formed over the dielectric layer 130 and the vias 132. The mask layer may be patterned to form openings that expose top surfaces of the vias 132. A seed layer is formed in the openings in the mask layer. The seed layer may include, for example, a titanium and copper bilayer (e.g., a layer of copper on a layer of titanium), a singular copper layer, or other suitable metal layer, and may be deposited using a PVD process (e.g., sputtering) or the like. A conductive material may then be deposited on the seed layer using a plating process, such as electroplating or electroless plating. The conductive material may include copper, titanium, or the like. The mask layer may then be removed using an acceptable ashing or stripping process. The seed layer and the overlying conductive material form a redistribution layer (RDL) 134 (sometimes referred to as a metallization pattern). The RDL 134 may be electrically connected to the plurality of integrated circuit dies 50 and the inner conductive cores 120.

Referring further to FIG. 14, a dielectric layer 136 is formed over the dielectric layer 130 and the RDL 134, such that the RDL 134 is embedded in the dielectric layer 136. The dielectric layer 136 may be formed using similar processes and similar materials as those described above in FIG. 13 for the formation of the dielectric layer 130. After the formation of the dielectric layer 136, vias 138 are then formed in the dielectric layer 136 using similar processes and similar materials as those described above in FIG. 13 for the formation of the vias 132. The vias 138 are in physical contact with the RDL 134 and are electrically connected to the plurality of integrated circuit dies 50 and the inner conductive cores 120.

Figure 15:
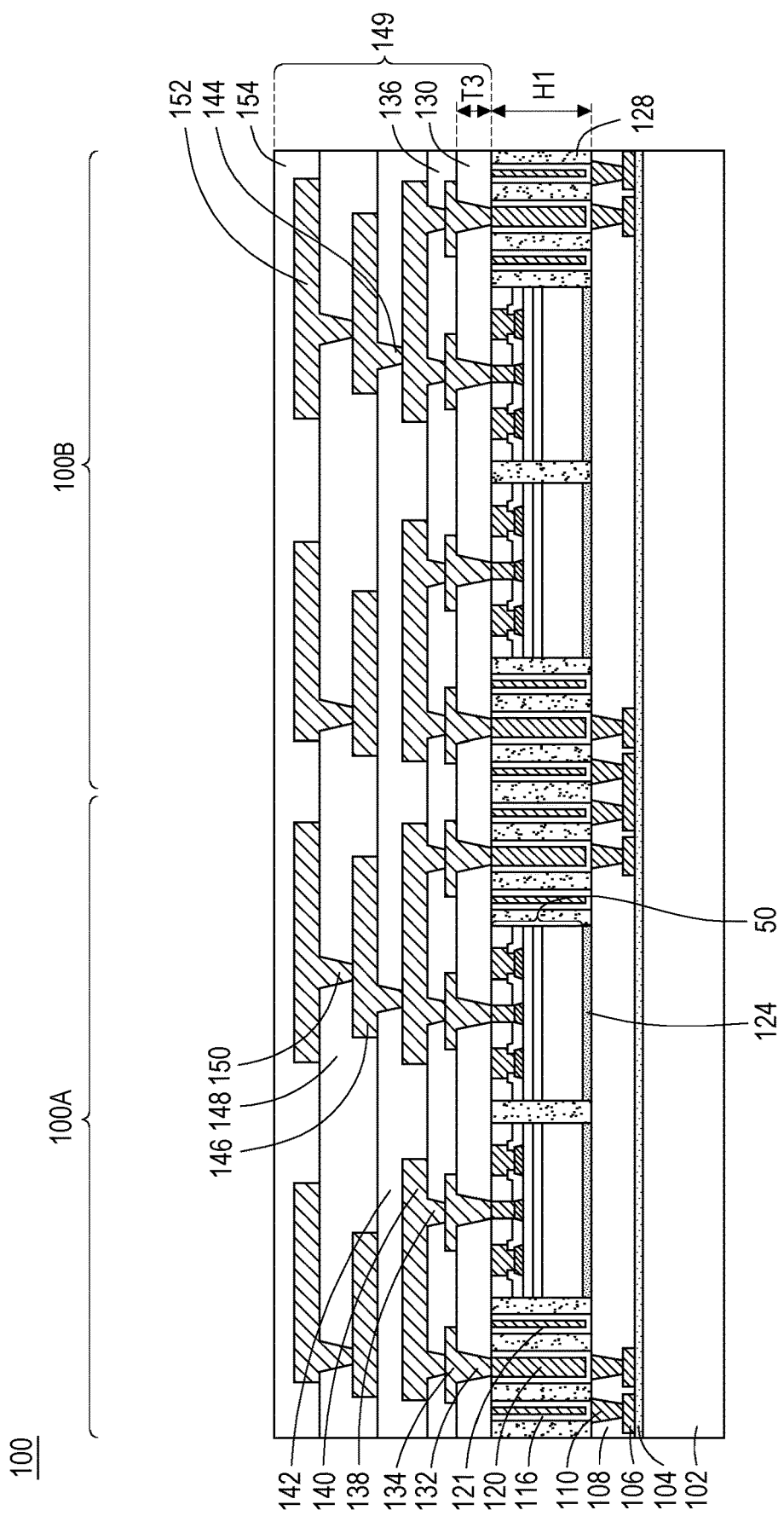

In FIG. 15, a redistribution layer (RDL) 140 (sometimes referred to as a metallization pattern) is formed over the dielectric layer 136 and the vias 138. The RDL 140 is formed using similar processes and similar materials as those described above in FIG. 14 for the formation of the RDL 134. After the formation of the RDL 140, a dielectric layer 142 is formed over the dielectric layer 136 and the RDL 140, such that the RDL 140 is embedded in the dielectric layer 142. The dielectric layer 142 may be formed using similar processes and similar materials as those described above in FIG. 13 for the formation of the dielectric layer 130. After the formation of the dielectric layer 142, vias 144 are then formed in the dielectric layer 142 using similar processes and similar materials as those described above in FIG. 13 for the formation of the vias 132. The vias 144 are in physical contact with the RDL 140. The inner conductive cores 120 may be electrically connected to the plurality of integrated circuit dies 50 through the RDL 140.

Further referring to FIG. 15, a redistribution layer (RDL) 146 (sometimes referred to as a metallization pattern) is formed over the dielectric layer 142 and the vias 144. The RDL 146 is formed using similar processes and similar materials as those described above in FIG. 14 for the formation of the RDL 134. After the formation of the RDL 146, a dielectric layer 148 is formed over the dielectric layer 142 and the RDL 146, such that the RDL 146 is embedded in the dielectric layer 148. The dielectric layer 148 may be formed using similar processes and similar materials as those described above in FIG. 13 for the formation of the dielectric layer 130. After the formation of the dielectric layer 148, vias 150 are then formed in the dielectric layer 148 using similar processes and similar materials as those described above in FIG. 13 for the formation of the vias 132. The vias 150 are in physical contact with the RDL 146 and are electrically connected to the plurality of integrated circuit dies 50 and the inner conductive cores 120. A redistribution layer (RDL) 152 (sometimes referred to as a metallization pattern) is formed over the dielectric layer 148 and the vias 150. The RDL 152 is formed using similar processes and similar materials as those described above in FIG. 14 for the formation of the RDL 134. After the formation of the RDL 152, a dielectric layer 154 is formed over the dielectric layer 148 and the RDL 152, such that the RDL 152 is embedded in the dielectric layer 154. The dielectric layer 154 may be formed using similar processes and similar materials as those described above in FIG. 13 for the formation of the dielectric layer 130. The front-side redistribution structure 149 is shown as an example having four layers of metallization patterns. More or fewer dielectric layers and metallization patterns may be formed in the front-side redistribution structure 149. If fewer dielectric layers and metallization patterns are to be formed, steps and process discussed above may be omitted. If more dielectric layers and metallization patterns are to be formed, steps and processes discussed above may be repeated.

Figure 16:
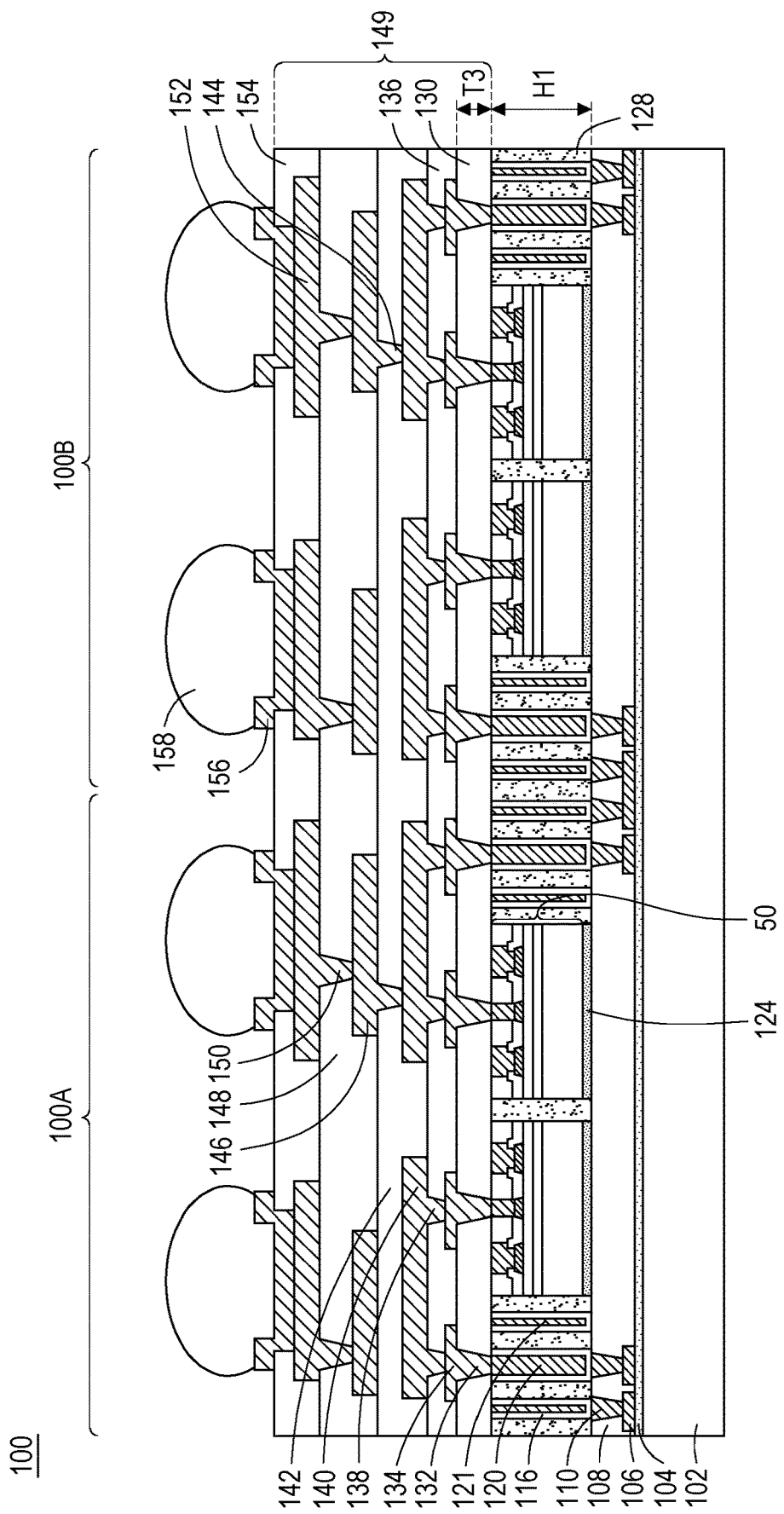

In FIG. 16, the dielectric layer 154 is patterned using acceptable photolithography and etching techniques to form openings in the dielectric layer 154 that expose top surfaces of the RDL 152. A conductive metal such as copper, titanium, or the like, is deposited over the dielectric layer 154 and in the openings in the dielectric layer 154 using for example, sputtering, evaporation, PECVD, or the like. Suitable photolithographic masking and etching process are then used to remove portions of the conductive metal, and the remaining portions of the conductive metal form the under bump metal (UBM) pads 156. Conductive connectors 158 are formed on the UBM pads 156. The conductive connectors 158 may be solder balls, metal pillars, metal vias, or the like. The conductive connectors 158 may include a conductive material such as solder, or the like. In some embodiments, the conductive connectors 158 are formed by initially forming a layer of solder through evaporation, electroplating, printing, solder transfer, ball placement, or the like. Once a layer of solder has been formed on the structure, a reflow may be performed in order to shape the material into the desired bump shapes. The conductive connectors 158 may be used to provide electrical input/output (I/O) to circuitry of the plurality of integrated circuit dies 50. In addition, the conductive connectors 158 may also be electrically connected to the RDL 106 of the back-side redistribution structure through the front-side redistribution structure 149 and the inner conductive cores 120.

Figure 17:
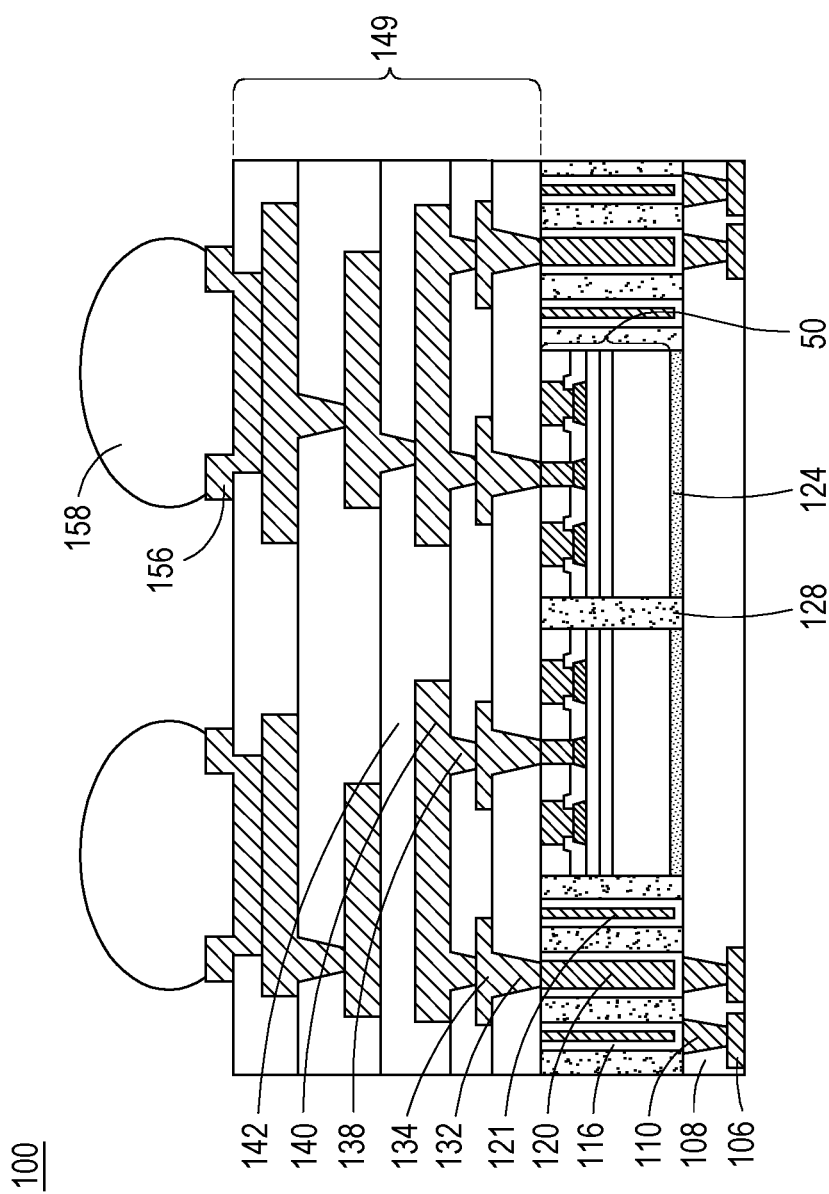

In FIG. 17, a carrier substrate de-bonding is performed to detach (or "de-bond") the carrier substrate 102 from the dielectric layer 108. In accordance with some embodiments, the de-bonding includes projecting a light such as a laser light or an UV light on the release layer 104 so that the release layer 104 decomposes under the heat of the light and the carrier substrate 102 can be removed. After the carrier substrate 102 is de-bonded from the dielectric layer 108, a singulation process is then performed by sawing along scribe line regions, e.g., between the first package region 100A and the second package region 100B. The sawing singulates the first package region 100A from the second package region 100B. The resulting, singulated device stack is from one of the first package region 100A or the second package region 100B.

Advantages can be achieved as a result of the formation of the first package component 100 comprising the via 113 that electrically couples the RDL 106 of the back-side redistribution structure to the front-side redistribution structure 149. The via 113 is co-axial in structure and includes the inner conductive core 120 and the outer conductive shielding layer 121. The molding material 128 surrounds the inner conductive core 120, and the outer conductive shielding layer 121 surrounds the inner conductive core 120 and the molding material 128. The outer conductive shielding layer 121 includes copper and/or copper alloy, and is electrically grounded. A difference between an outer radius and an inner radius of the outer conductive shielding layer 121 is in the range from 0.5 μm to 150 μm. The inner conductive core 120 transmits electrical signal and is separated from the outer conductive shielding layer 121 by the molding material 128, wherein the molding material 128 disposed between the inner conductive core 120 and the outer conductive shielding layer 121 has the width W3 in the range from 0.5 μm to 200 μm. These advantages may allow for a reduction in electromagnetic 5G/6G high-frequency interference to the inner conductive core 120. In addition, the number of isolation lines and vias of the first package component 100 can be reduced. Further, one or more embodiments disclosed herein allows for shorter interconnect lengths between package elements, which allows for reduced time delays and improved suitability of the first package component 100 for advanced portable products. Additionally, because the formation process of the via 113 is compatible with current processes, manufacturing costs are reduced and efficiency is increased.

In accordance with an embodiment, a package structure includes a first redistribution structure; an insulating material over the first redistribution structure; a die embedded in the insulating material; a second redistribution structure over the die and the insulating material; and a first via extending through the insulating material, where the first via includes a first inner conductive core; and a first outer conductive shielding layer, where the insulating material is disposed between the first inner conductive core and the first outer conductive shielding layer, and where the first outer conductive shielding layer has an annular shape in a top-down view. In an embodiment, a difference between an outer radius and an inner radius of the first outer conductive shielding layer is in a range from 0.5 μm to 150 μm. In an embodiment, the insulating material electrically isolates the first inner conductive core from the first outer conductive shielding layer. In an embodiment, the insulating material disposed between the first inner conductive core and the first outer conductive shielding layer has a width that is in a range from 0.5 μm to 200 μm. In an embodiment, the first outer conductive shielding layer is electrically grounded. In an embodiment, the first outer conductive shielding layer includes copper. In an embodiment, the package structure further includes a second via extending through the insulating material, where the second via includes a second inner conductive core; and a second outer conductive shielding layer, and where the die is disposed between the first via and the second via.

In accordance with an embodiment, a package includes a first redistribution structure; a die disposed over the first redistribution structure; a molding material surrounding the die; a second redistribution structure over the die and the molding material; and a first via including a first portion extending through the molding material, the first portion of the first via electrically connecting the first redistribution structure to the second redistribution structure; and a second portion extending through the molding material, where the first portion of the first via is encircled by the second portion of the first via, and where a difference between an outer radius and an inner radius of the second portion is in a range from 0.5 μm to 150 μm. In an embodiment, the first portion of the first via and the second portion of the first via are electrically isolated from each other by the molding material. In an embodiment, a width of the molding material disposed between the first portion of the first via and the second portion of the first via is in a range from 0.5 μm to 200 μm. In an embodiment, the second portion includes an annular shape in a top-down view. In an embodiment, top surfaces of the first portion of the first via and the second portion of the first via are level with a top surface of the die. In an embodiment, the package further includes conductive connectors electrically connected to the die and the first portion of the first via. In an embodiment, the second portion of the first via is electrically grounded through the first redistribution structure.

In accordance with an embodiment, a method of forming an integrated circuit package includes forming a first redistribution structure over a carrier; forming a first via and a second via over the first redistribution structure, where each of the first via and the second via include an inner core; and an outer shielding layer, where the outer shielding layer encircles the inner core; attaching a first die to the first redistribution structure, where the first die is disposed between the first via and the second via; and forming a second redistribution structure over the first die, the first via and the second via. In an embodiment, the method further includes forming a molding material over the first via, the second via and the first die, where the molding material surrounds the first die, the first via, and the second via. In an embodiment, the molding material electrically isolates the inner core of the first via from the outer shielding layer of the first via, and where the molding material electrically isolates the inner core of the second via from the outer shielding layer of the second via. In an embodiment, the method further includes after forming the molding material planarizing a top surface of the molding material to expose top surfaces of the inner core of the first via, the outer shielding layer of the first via, the inner core of the second via, and the outer shielding layer of the second via. In an embodiment, after planarizing the top surface of the molding material a height of the inner core of the first via and a height of the outer shielding layer of the first via are the same. In an embodiment, forming the first via includes forming the inner core of the first via and the outer shielding layer of the first via at the same time, where the inner core of the first via and the outer shielding layer of the first via include the same material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure comprising:
   a first redistribution structure;
   an insulating material over the first redistribution structure;
   a die embedded in the insulating material;
   a second redistribution structure over the die and the insulating material; and
   a first via extending through the insulating material, wherein the first via comprises:
      a first inner conductive core; and
      a first outer conductive shielding layer, wherein the insulating material is disposed between the first inner conductive core and the first outer conductive shielding layer, and wherein the first outer conductive shielding layer has an annular shape in a top-down view.

2. The package structure of claim 1, wherein a difference between an outer radius and an inner radius of the first outer conductive shielding layer is in a range from 0.5 µm to 150 µm.

3. The package structure of claim 1, wherein the insulating material electrically isolates the first inner conductive core from the first outer conductive shielding layer.

4. The package structure of claim 1, wherein the insulating material disposed between the first inner conductive core and the first outer conductive shielding layer has a width that is in a range from 0.5 µm to 200 µm.

5. The package structure of claim 1, wherein the first outer conductive shielding layer is electrically grounded.

6. The package structure of claim 1, wherein the first outer conductive shielding layer comprises copper.

7. The package structure of claim 1, further comprising:
   a second via extending through the insulating material, wherein the second via comprises:
      a second inner conductive core; and
      a second outer conductive shielding layer, and wherein the die is disposed between the first via and the second via.

8. A package comprising:
   a first redistribution structure;
   a die disposed over the first redistribution structure;
   a molding material surrounding the die;
   a second redistribution structure over the die and the molding material; and
   a first via comprising:
      a first portion extending through the molding material, the first portion of the first via electrically connecting the first redistribution structure to the second redistribution structure; and
      a second portion extending through the molding material, wherein the first portion of the first via is encircled by the second portion of the first via, wherein a difference between an outer radius and an inner radius of the second portion is in a range from 0.5 µm to 150 µm, and wherein the first portion of the first via and the second portion of the first via are electrically isolated from each other by the molding material.

9. The package of claim 8, wherein a width of the molding material disposed between the first portion of the first via and the second portion of the first via is in a range from 0.5 µm to 200 µm.

10. The package of claim 8, wherein the second portion comprises an annular shape in a top-down view.

11. The package of claim 8, wherein top surfaces of the first portion of the first via and the second portion of the first via are level with a top surface of the die.

12. The package of claim 8, further comprising:
   conductive connectors electrically connected to the die and the first portion of the first via.

13. The package of claim 8, wherein the second portion of the first via is electrically grounded through the first redistribution structure.

14. The package of claim 8, wherein the second portion of the first via comprises copper.

15. A method of forming an integrated circuit package, the method comprising:
   forming a first redistribution structure over a carrier;
   forming a first via and a second via over the first redistribution structure, wherein each of the first via and the second via comprise:
      an inner core; and
      an outer shielding layer, wherein the outer shielding layer encircles the inner core;
   attaching a first die to the first redistribution structure, wherein the first die is disposed between the first via and the second via;
   forming a molding material over the first via, the second via and the first die, wherein the molding material surrounds the first die, the first via, and the second via, wherein the molding material electrically isolates the inner core of the first via from the outer shielding layer of the first via; and
   forming a second redistribution structure over the first die, the first via and the second via.

16. The method of claim 15, wherein the molding material electrically isolates the inner core of the second via from the outer shielding layer of the second via.

17. The method of claim 15 further comprising:
   after forming the molding material planarizing a top surface of the molding material to expose top surfaces of the inner core of the first via, the outer shielding layer of the first via, the inner core of the second via, and the outer shielding layer of the second via.

18. The method of claim 17, wherein after planarizing the top surface of the molding material a height of the inner core of the first via and a height of the outer shielding layer of the first via are the same.

19. The method of claim 15, wherein forming the first via comprises forming the inner core of the first via and the outer shielding layer of the first via at the same time, wherein the inner core of the first via and the outer shielding layer of the first via comprise the same material.

20. The method of claim 15, wherein the inner core of the first via has a width that is in a range from 10 μm to 300 μm.

* * * * *